(12) United States Patent
Rumennik

(10) Patent No.: US 6,600,182 B2
(45) Date of Patent: Jul. 29, 2003

(54) HIGH CURRENT FIELD-EFFECT TRANSISTOR

(76) Inventor: Vladimir Rumennik, 27915 Roble Blanco Ct., Los Altos Hills, CA (US) 94022

( * ) Notice: Subject to any disclaimer, the term of this patent is extended or adjusted under 35 U.S.C. 154(b) by 45 days.

(21) Appl. No.: 09/965,690

(22) Filed: Sep. 26, 2001

(65) Prior Publication Data

US 2003/0057459 A1 Mar. 27, 2003

(51) Int. Cl.$^7$ ............................................. H01L 29/76
(52) U.S. Cl. ...................... 257/288; 257/155; 257/328; 257/329; 257/330; 257/331; 257/334
(58) Field of Search .................. 257/155, 328, 257/329, 330, 331, 334, 336, 341, 342, 347, 409

(56) References Cited

U.S. PATENT DOCUMENTS

| | | | |
|---|---|---|---|
| 4,738,936 A | | 4/1988 | Rice |
| 5,760,440 A | * | 6/1998 | Kitamura et al. |
| 5,821,144 A | | 10/1998 | D'Anna et al. |
| 5,869,875 A | | 2/1999 | Herbert |
| 5,998,833 A | | 12/1999 | Baliga |
| 6,049,108 A | * | 4/2000 | Williams et al. |
| 6,294,818 B1 | * | 9/2001 | Fujihira |

OTHER PUBLICATIONS

Jun Cai, Changhong Ren, et al. , High Performance Stacked LDD RF LDMOSFET, Proceedings of 2001 International Symposium on Power Semiconductor Devices & PCs, Osaka, Japan; pp. 103–106.*

*High Performance Stacked LDD RF LDMOSFET*, Jun Cai, Changhong Ren, et al., Proceedings of 2001 International Symposium on Power Semiconductor Devices & PCs, Osaka, Japan; pp. 103–106.

* cited by examiner

Primary Examiner—David Nelms
Assistant Examiner—Mai-Huong Tran
(74) Attorney, Agent, or Firm—Burgess & Bereznak, LLP (57) ABSTRACT

A MOSFET that provides high current conduction at high frequency includes a deposited layer over a substrate of a first conductivity type, with source and drain regions adjoining a top surface of the epitaxial layer. The drain region has a first portion that extends vertically through the epitaxial layer to connect to the substrate and a second portion that extends laterally along the top surface. A first region is disposed in the epitaxial layer between the extended region and the source region. An insulated gate is located above the first region between the source region and the second portion of the drain region. A drain metal layer contacts a bottom surface of the substrate, and a source metal layer that substantially covers the top surface connect to the source region.

32 Claims, 11 Drawing Sheets

HIGH CURRENT FIELD-EFFECT TRANSISTOR

FIELD OF THE INVENTION

The present invention relates to field-effect semiconductor transistor structures with high current capability.

BACKGROUND OF THE INVENTION

In the past several years, trench-based vertical MOSFET devices have emerged as a dominant technology for high power applications. These devices can achieve a relatively high blocking voltage in the off state while minimizing the resistance to current flow in the "on" state using high cell density. The acronym Rds(on)×A refers to the product of the resistance and surface area, and is generally used to describe the on-state performance of the device. It is well known that these devices can achieve a low Rds(on) and a relatively high voltage blocking. An example of a trench-based vertical MOSFET power device is found in U.S. Pat. No. 5,998,833.

One of the problems, however, with these trench devices is that they suffer from increased gate capacitance and Miller capacitance, which negatively affects device operation at high frequencies. This results in a proportional increase in the switching (AC) power losses at high frequency.

Lateral MOSFET devices have a much lower drain-to-gate overlapping and therefore a much lower Miller capacitance as compared with vertical devices. In general, lateral devices also have a comparable on-state resistance to that of vertical structures, but with lower parasitic capacitance values. Hence, lateral MOSFETS are usually better suited for high frequency operations. For instance, lateral MOSFETs are commonly used in RF and microwave amplifiers operating in the gigahertz (GHz) frequency range. Examples of traditional lateral MOSFET device structures for power applications include U.S. Pat. Nos. 5,869,875, 5,821,144, 5,760,440, and 4,748,936.

Traditionally designed lateral MOSFETs have a P+ region near the source, often called a sinker. The purpose of the sinker is to provide a good contact to the P-body region under the source for more efficient hole collection. This relatively deep P+ region protrudes through the epitaxial region and reaches into the P+ substrate. U.S. Pat. Nos. 5,869,875 and 5,821,144 teach replacing the relatively wide P+ sinker diffusion in a traditional DMOS structure with either a conducting trench or a partial trench with a P+ sinker diffusion region. The result is a smaller cell size and lower on resistance. However, the drain electrode structure limits the current conduction capability in these structures, since current flows only through narrow metal drain strips.

U.S. Pat. No. 4,748,936 also discloses a MOS device with a trench in the epitaxial layer that also suffers from drain current flow through the metal formed of stripes to the appropriate wire bonding area. In this approach, like the others described above, improvement in the lateral device relates to cell area reduction. This area reduction is achieved by replacing the diffused sinker area (that consumes a lot of area connecting the source to the substrate) with an etched trench structure. One of the chief drawbacks, however, of the aforementioned device structures is that they do not provide for adequate high current conduction.

The device structure taught in U.S. Pat. No. 5,760,440 does provide improved current conduction in a lateral MOSFET transistor; however, the teaching of this patent is limited to n-channel transistors having a N+ substrate and a P-type epitaxial structure. As a result, the P-type epitaxial region is not effectively connected to the source region and there is a problem with hole extraction from the P-body under the source. One consequence of this is that the device structure suffers from weak safe operating area (SOA) performance level and poor reliability.

Thus, there is an unsatisfied need for a transistor device structure that solves the problem of high parasitic Miller capacitance inherent in vertical devices, and which at the same time overcomes the low current conduction problem normally associated with lateral devices, as well as provide a high safe operating/reliability level. In other words, what is needed is a power transistor that provides improved high frequency operation at high current densities.

BRIEF DESCRIPTION OF THE DRAWINGS

The present invention is illustrated by way of example, and not imitation, in the figures of the accompanying drawings, wherein.

DETAILED DESCRIPTION

A lateral metal-oxide-semiconductor field-effect transistor (MOSFET) with high current, fast switching capabilities is described. The MOSFET has a low specific on-state resistance and supports high current flow. In the following description, numerous specific details are set forth, such as material types, doping levels, structural features, processing steps, etc., in order to provide a thorough understanding of the present invention. Practitioners having ordinary skill in the semiconductor arts will understand that the invention may be practiced without many of these details. In other instances, well-known elements, techniques, and processing steps have not been described in detail to avoid obscuring the invention.

Figure 1:
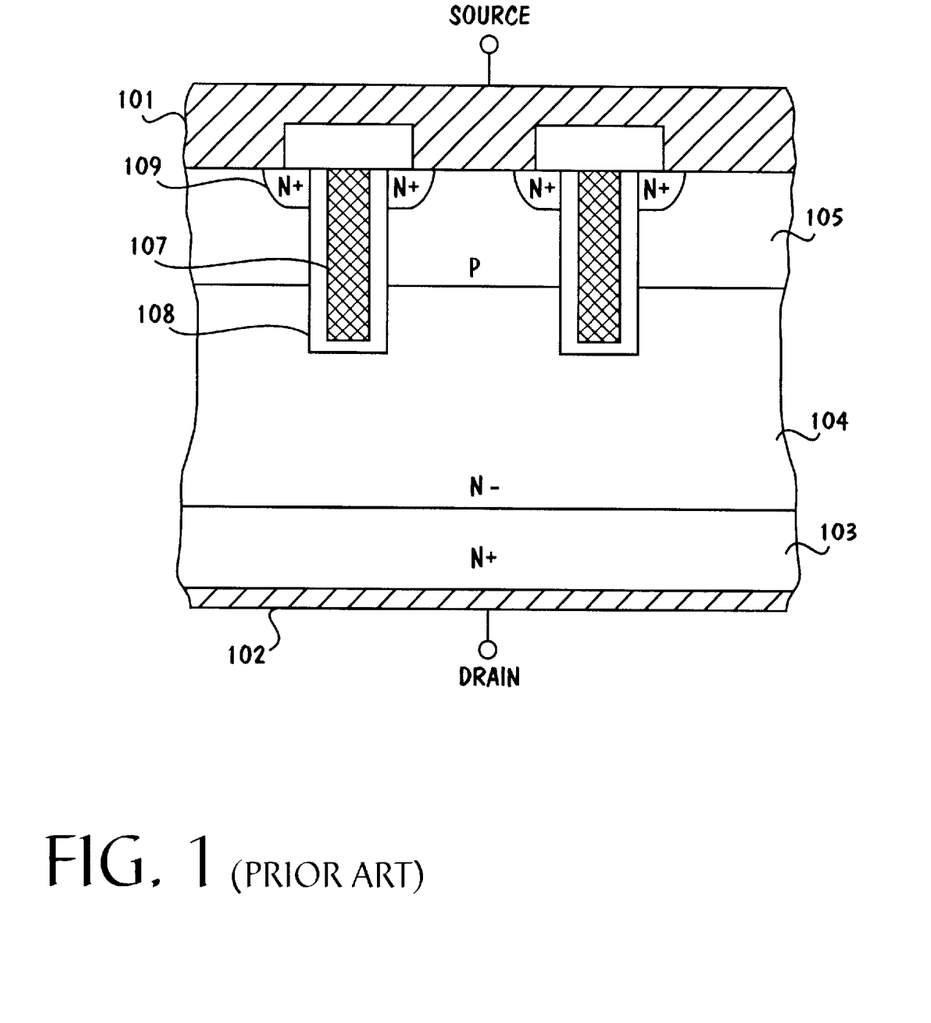
FIG. 1 is a cross-sectional side view of a prior art trench-based vertical MOSFET.

FIG. 1 is a cross-sectional side view of a conventional power MOSFET that includes a trench gate 107 insulated from the semiconductor substrate by oxide layer 108. Gate 107 extends down through p-type layer 105 into n-type layer 104, which is disposed above N+ drain region 103. Source regions 109 adjoin gate 107 at the upper surface of the substrate. Current flows vertically from source electrode 101, into source regions 109, down through the channel regions formed adjacent to the gate 107, across extended drain region 104 and drain region 103, to drain electrode 102.

Although current is efficiently transferred through the metalized top and bottom electrodes in the transistor of FIG. 1, the capacitance formed between the trench gate 107 and silicon regions 104 and 105 negatively affects device performance at high frequencies. Basically, this capacitance causes an increase in switching power losses that is proportional to the frequency of operation. For this reason, practitioners in the semiconductor arts have generally preferred lateral device structures for high frequency power applications. However, as previously discussed the drawback of prior art lateral MOSFET power devices is either their inability to provide efficient current conduction or their safe operating area (SOA) weakness when high current and high voltage are simultaneously applied.

Figure 2:
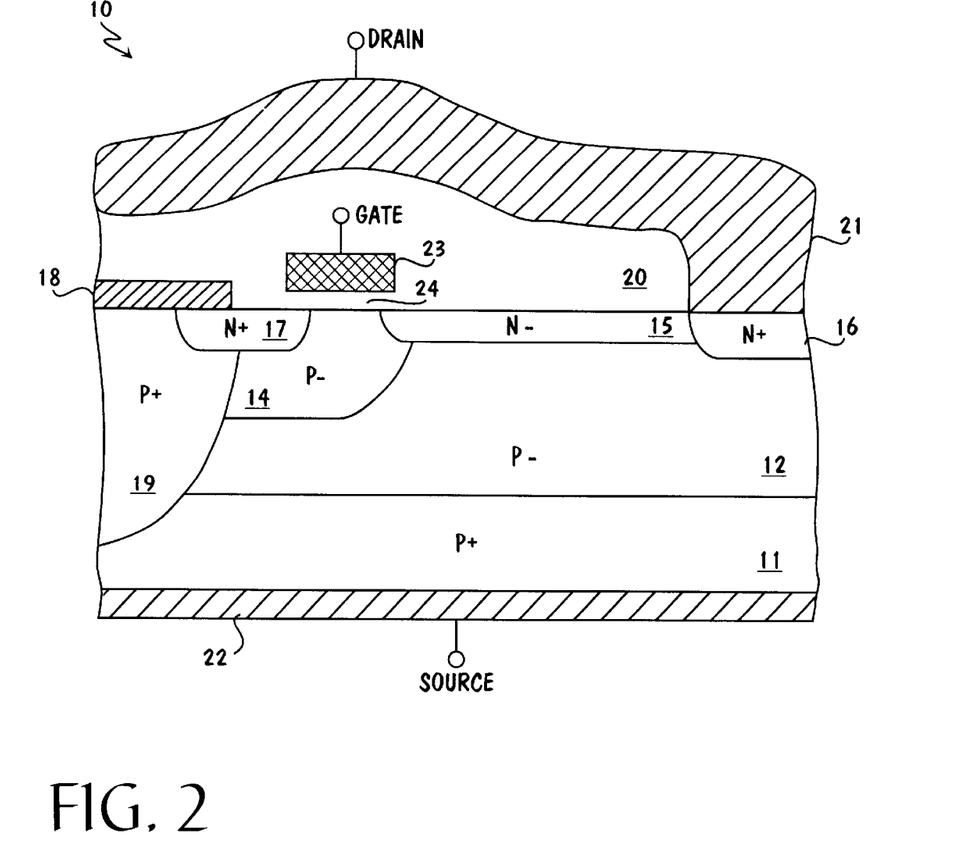
FIG. 2 is a cross-sectional side view of one embodiment of a lateral MOSFET device structure in accordance with the present invention.

The present invention solves the aforementioned problems with a device structure that provides high current conduction capability at high frequencies without substantial power losses, and which also has a high SOA level of operation. Referring to FIG. 2 there is shown one embodiment of the MOSFET power device of the present invention. It should be understood that the elements in the figures are representational, and are not drawn to scale in the interest of clarity. It is also appreciated that a p-channel transistor may be realized by utilizing the opposite conductivity types for all of the illustrated diffusion/doped regions.

The device of FIG. 2 comprises a MOSFET 10 having a gate 23 (comprised, for example, of polysilicon), and a gate-insulating layer 24 that insulates gate 23 from the underlying semiconductor regions. Gate-insulating layer 24 may comprise ordinary silicon dioxide or another appropriate dielectric insulating material. In one embodiment gate 23 comprises polysilicon formed with a silicide top layer to reduce gate resistance. The gate is about 1 micron long and insulating layer 24 is approximately 300–500 angstroms thick.

MOSFET 10 also includes a source region 17 and a drain region 16. In the example of FIG. 1, both regions 16 & 17 are highly doped (N+) with arsenic and formed to a depth of about 0.3 microns. An extended drain region 15 connects with drain region 16. To achieve a breakdown voltage of around 10–20V, extended drain region may be fabricated about 1.0 microns long, 0.3–0.5 microns thick, and doped to have a net charge of approximately $2 \times 10^{12}$ to $3 \times 10^{12}$ cm$^{-2}$.

A P-type region 14 is shown formed in P-type semiconductor (e.g., epitaxial) layer 12 separating extended drain region 15 from source region 17. Region 14 prevents punch-through between the source and drain. P-type region 14 also controls the threshold voltage of the transistor and prevents the parasitic NPN bipolar transistor from turning on. By way of example, P-type region 14 may be formed with a diffusion of implanted boron impurities of about $1 \times 10^{14}$ cm$^{-2}$.

Note that gate 23 slightly overlaps N+ Source region 17 and the extended drain region 15 to provide continuous conduction in the channel region of the device. The overlap with region 14 also enables higher breakdown voltage of the device. However, the overlap between layers 14 & 15 is not required for the device operation. The channel region of MOSFET 10 is defined at one end by N+ source region 17 and at the other end by N-type extended drain region 15. A channel of electrons is formed along the surface of P-type region 14 just below gate 23 when the MOSFET device is turned on by application of a sufficient voltage to the gate.

The thickness of gate insulating layer 24 is made sufficiently large (300–500 angatroms) to avoid high gate capacitance, thereby providing good high frequency performance. Epitaxial layer 12 is formed on top of a P+ substrate 11. To achieve a desired breakdown voltage in the device structure of FIG. 2 the charge in layer 12 is balanced and optimized for highest breakdown voltage (BVD) and lowest Rds(on). In the example of FIG. 2, the optimized resistance of the extended drain region 15 is in the range of 1500–2500 ohm/sq. The epitaxial layer is doped to a concentration of about $1 \times 10^{16}$ cm$^{-3}$ is fabricated to be about 3 microns thick.

Substrate region 11 is highly doped to provide a low resistance path for the current in the on-state. By way of example, substrate 11 may be formed with a resistivity of about 0.01–0.003 ohm-cm with a typical thickness of about 250 microns. Source electrode 22 is formed along the bottom of the wafer and is electrically connected to P+ substrate 11. Metalization of the bottom surface of the wafer in this manner facilitates future connection with a package electrode. In one embodiment, both the top and bottom metalization layers 21 & 22, respectively, comprise layers of Ti, Ni, and Ag, each of sub-micron thickness. In another embodiment, the top layer 21 is Aluminum or Aluminum alloy.

Conducting region 18 is disposed at the top surface of the wafer to electrically short or connect source region 17 with P+ region 19. Conducting region 18 may comprise any of a variety of metals, alloys, doped semiconductor material, suicides, etc., sufficient for this purpose. Region 19, which, for example, may be formed by a diffusion of boron, extends from the surface down to P+ substrate 11 to provide a low conductivity path between N+ source region 17 and source electrode 22. This connection facilitates high current flow to the source metalization along the bottom surface of the wafer.

Covering the top surface of the wafer is an interlayer dielectric 20, which may comprise silicon dioxide. Dielectric 20 electrically insulates gate 23 from drain metalization layer 21, which covers the entire surface area of the wafer over the transistor and contacts N+ drain region 16 (except for the small area of gate contact). Interlayer dielectric layer 20 is made sufficiently thick (e.g., 1 micron) to minimize drain-to-gate capacitance for improved high frequency performance. At the same time, the large dimensions of drain metal layer 21 provide a large current conduction capability to the drain region of the device. In an alternative embodiment, drain metal layer 21 may comprise multiple layers of metal or metal alloys. In addition, drain metal 21 may be either wire bonded or soldered directly to the external package electrode.

In the on state, a sufficient voltage is applied to the gate such that a channel of electrons is formed along the surface of the P-body region 14. This provides a path for electron current flow from source electrode 22, N+ source region 17, through the channel regions formed in P-body region 14, through the N-type drift region 15, through the N+ drain region 16 and into the metal drain electrode 21.

Another embodiment of a MOSFET power device according to the present invention has opposite conduction polarity for the substrate 11, epitaxial layer 12, and deep diffusion region 19. All three regions are of the second conductivity type in this alternative embodiment. Region 14 is connected to layer 18 in another plane of view (not shown in FIG. 2).

Figure 3:
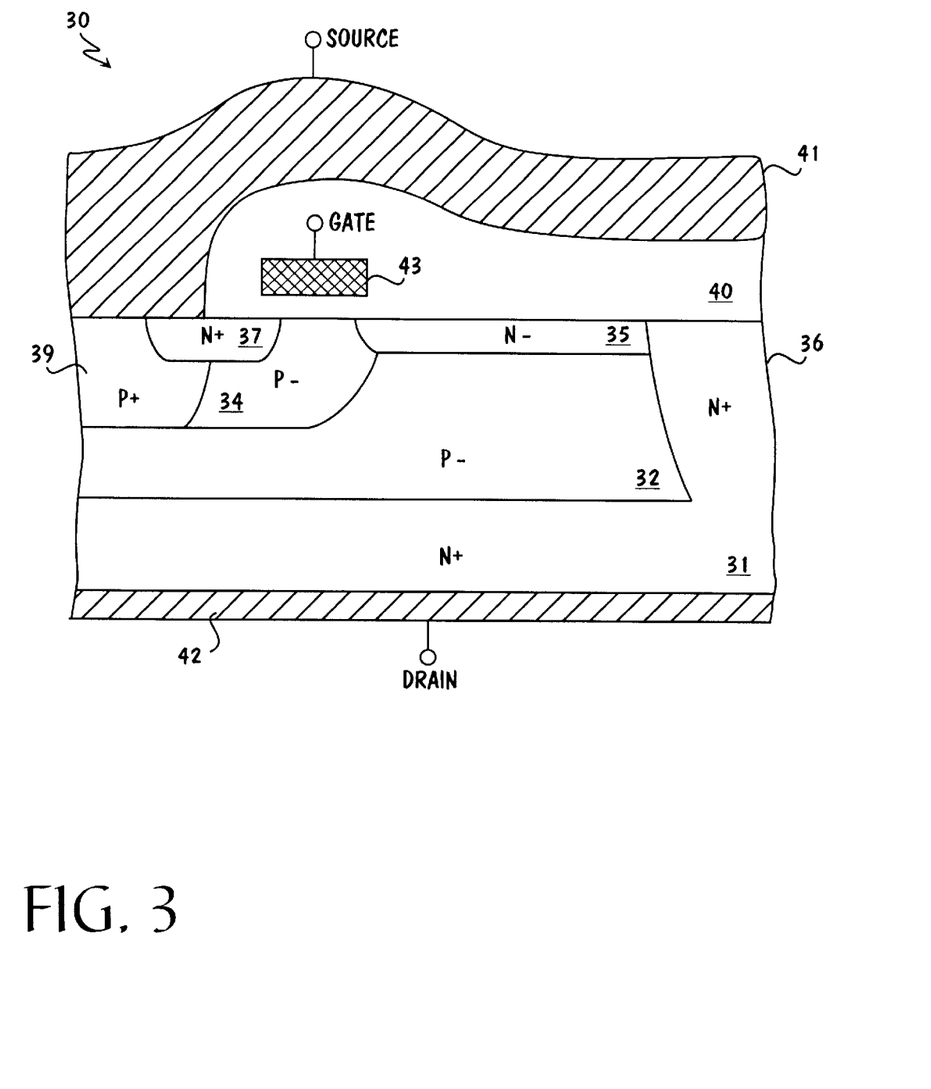
FIG. 3 is a cross-sectional side view of an alternative embodiment of the lateral MOSFET of the present invention.

FIG. 3 illustrates another embodiment of a MOSFET power device 30 in accordance with the present invention. In this embodiment the extended drain region 35 is connected to the N+ substrate 31 via deep N+ diffusion region 36. The N+ substrate region 31 is highly doped to achieve a low resistance path to the drain electrode and has a resistivity of about 0.005 to 0.001 ohm-cm. The metalization on the bottom of the wafer forms the drain electrode 42. The P-type or N-type epitaxial layer 32 is about 3–5 microns thick and doped to about $1\times10^{16}$ cm$^{-3}$. The P+ region 39 is included to provide a low resistance connection between region 34 and source metal 41. Both regions 34 and 39 are approximately 0.5 to 1.0 microns deep.

In this configuration the source metal layer 41 covers the top of the device and connects to source region 37 and P+ region 39 either directly or through a barrier metal, depending on the type of metalization utilized. For example, WSi is an effective barrier for Al alloy metal. The source metal layer 41 covers the top of the wafer in a contiguous manner. Insulated gate is disposed over P-type region 34 extending from source region 37 to extended drain region 35. Interlayer dielectric 40 insulates source metal 41 from gate 43.

Figure 4:
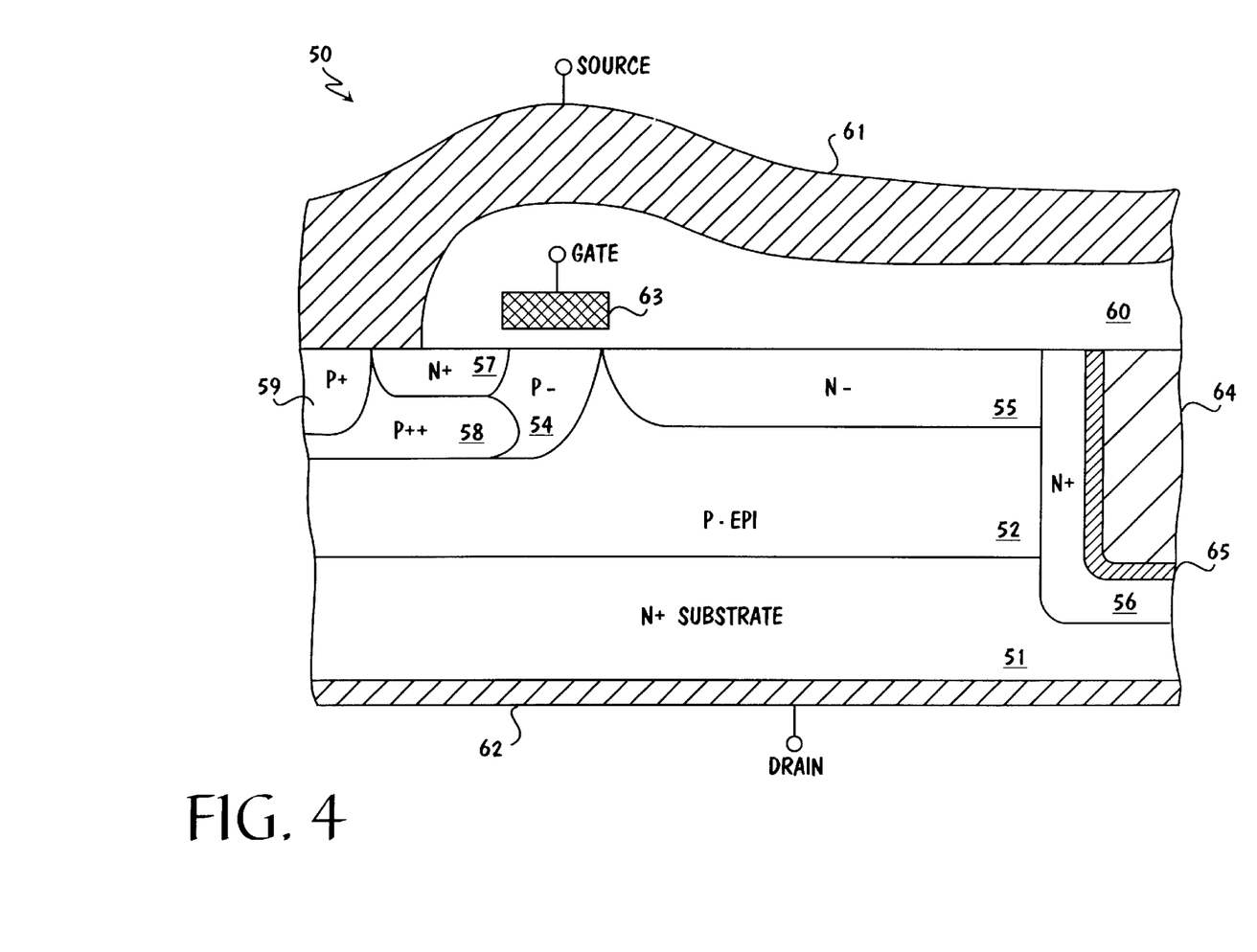
FIG. 4 is a cross-sectional side view of yet another embodiment of the lateral MOSFET of the present invention.

Another embodiment of the present invention is shown in the MOSFET device structure of FIG. 4. MOSFET 50 is similar to that shown in FIG. 3, however, the deep N+ diffusion connection the extended drain to the N+ substrate has been replaced by a relatively narrow trench structure to achieve area reduction. The narrow trench structure comprises N+ region 56 extending from extended drain region 55 through epitaxial region 52 to N+ substrate 51. Region 56 may be formed by a diffusion of impurities into the sidewalls and bottom of an etched trench. The diffusion depth may be minimal, e.g., 0.1 micron.

In the embodiment of FIG. 4 current flow through the extended drain region 55 is diverted to the bottom of the wafer via the conducting trench structure that includes either diffused region 56, silicide layer 65, or metal fill region 64, or any combination of them. For example, in one implementation the sidewall and bottom surface of the trench is covered with a conductive material, and/or is diffused into with an impurity, to provide a conducting path that connects the source region to the substrate. Other specific approaches for achieving vertical current flow through the trench are also possible, such as filling the trench with doped polysilicon, metal alloys, silicides, or a combination of several materials. Conduction may also be achieved primarily through the diffusion region 56 positioned on the sidewalls of the trench.

Furthermore, the trench walls may be partially or fully isolated from the conducting material inside the trench. For example, silicon dioxide may be used as an isolation layer. In this case, contact to the drain may be made by creating a conduction path from near the top of the trench sidewall or at the surface, down through the conducting material inside the trench (i.e., fill region 64) to the underlying substrate. Alternatively, metal fill region 64 may be replaced with a dielectric, such that all conduction takes place along the diffusion layer 56 or thin silicide layer 65 along the sidewall of the trench.

The device structure of FIG. 4 also includes optional P++ region 58, which is heavily doped P-type beneath N+ source region 57, P+ region 59, and gate 63. Region 58 improves device performance by suppressing the parasitic bipolar action of the N+ source region 57. It should be understood that MOSFET 50 could alternatively be fabricated without additional region 58. That is, P+ region 59 may extend down partially under region 57 in the same manner as shown in the embodiment of FIG. 3.

Figure 5:
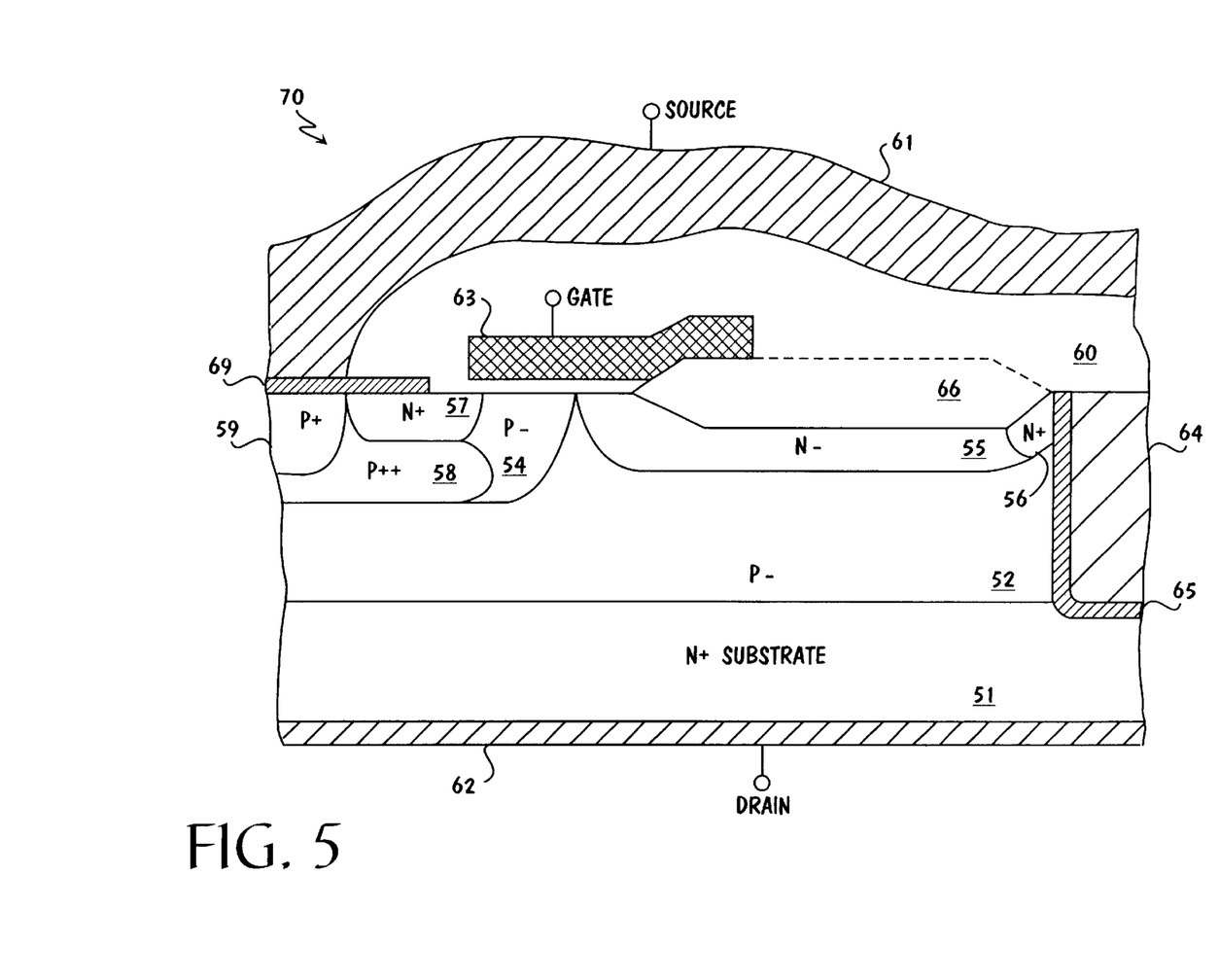
FIG. 5 is a cross-sectional side view of still another embodiment of the lateral MOSFET of the present invention.

FIG. 5 is yet another alternative embodiment of the present invention. The MOSFET 70 has the same basic device structure as shown in FIG. 4 except that it includes additional electric field shaping dielectric layer 66 partially formed into extended drain region 55. Gate 63 is deposited and patterned after formation of dielectric layer 66. The extension of gate 63 over the sloped, thicker dielectric layer 66 provides electric field plate shaping that further enhances BVD.

MOSFET 70 also includes conducting region 56 disposed at the top surface of the wafer. Region 56 facilitates current flow between extended drain region 55 and substrate 51 via conduction layer 65. In the embodiment of FIG. 5, only the conduction layer 65 and conductive fill region 64 covering the sidewalls and bottom of the trench are utilized to connect N+ drain region 56 with N+ substrate 51.

Figure 6A:
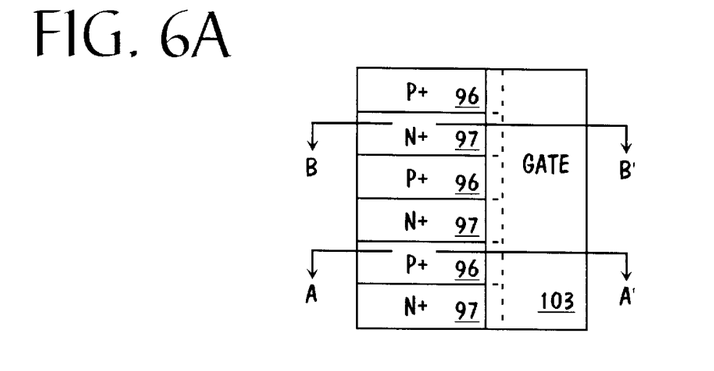
FIGS. 6A–6C are three different views of another embodiment of the lateral MOSFET of the present invention.
Figure 6B:
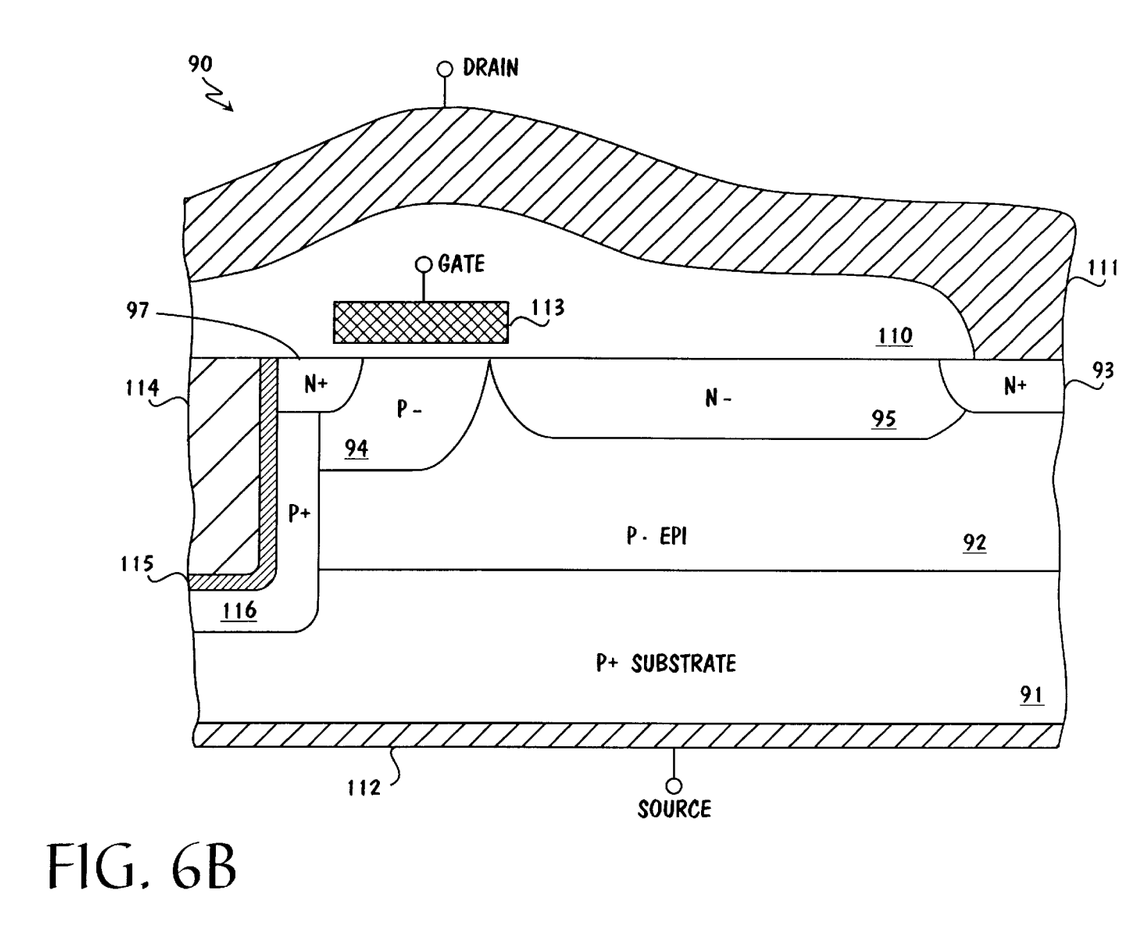
Figure 6C:
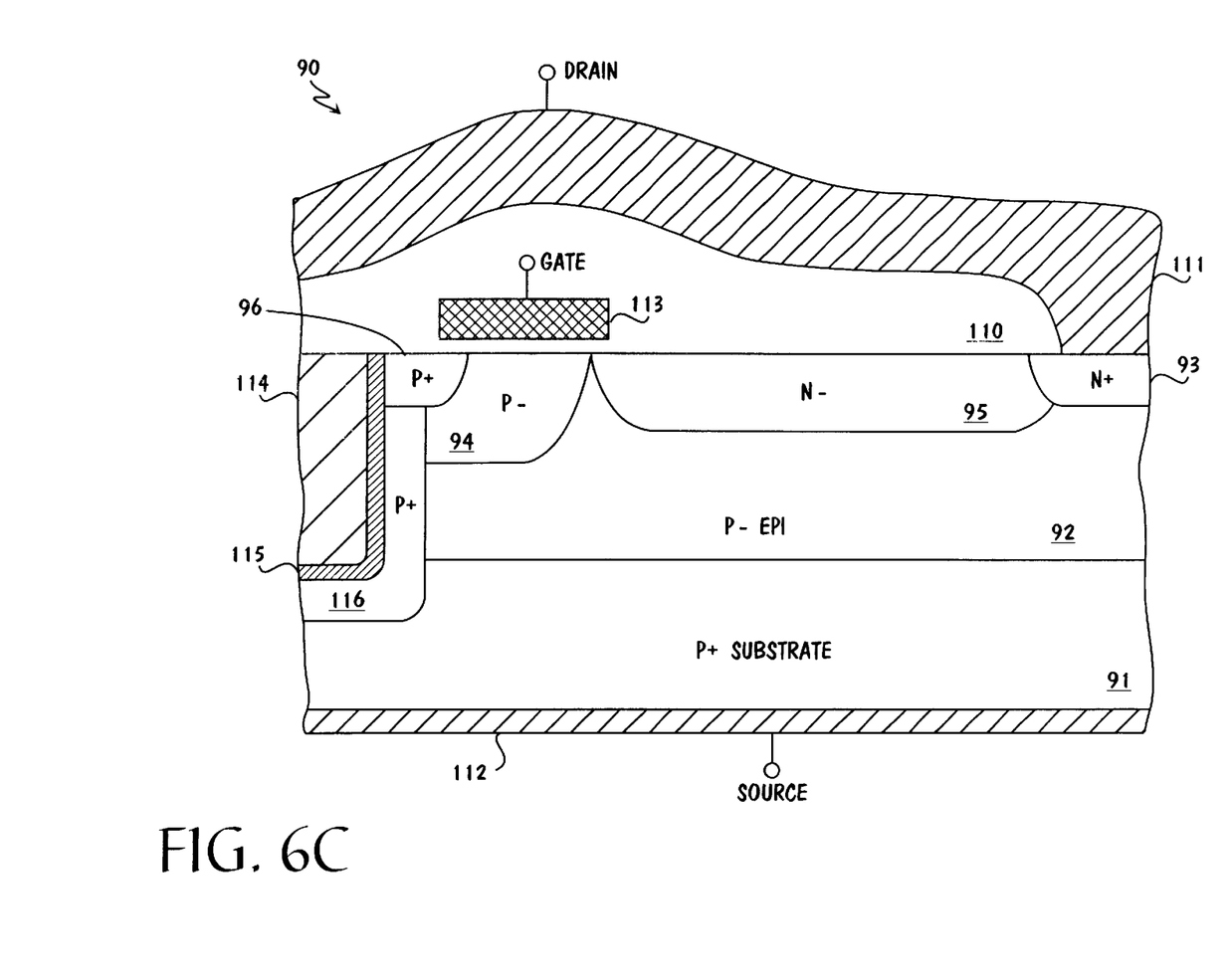

FIGS. 6A–6C illustrate another embodiment of the present invention. FIG. 6A is a partial top view showing alternating P+ regions 96 and N+ source regions 97, both extending under one edge of gate 103. The pattern for the P+ and N+ regions 96 and 97 determines the resistive path to P-type region 94. By way of example, in one implementation the P+ regions 96 are each 0.5 microns wide, repeating every 5 microns.

FIGS. 6B and 6O are each cross-sectional views taken along cut lines B–B' and A–A' respectively. As can be seen in FIG. 66, a trench structure is utilized to facilitate vertical current flow through epitaxial layer 92 between source electrode 112 plated to the bottom of P+ substrate 91 and N+ source region 97. In this embodiment, a P+ diffusion region 116 and suicide layer 115 is formed along the sidewall and bottom of the trench extending between source region 97 and substrate 91. This same vertical conduction structure connects to P+ regions 96, as shown in FIG. 6O. Fill region 114 may comprise metal, polysilicon, alloys, suicides, or other conducting material to further enhance vertical conduction. Alternatively, the trench may be partially filled with conducting material, and the remainder filled with a dielectric material such as silicon dioxide.

Like previous embodiments, MOSFET 90 includes a gate 113 disposed above P-type region 94 that spans across the wafer surface from regions 96 & 97 to extended drain region 95. Region 95 is connected to N+ drain region 93. Dielectric layer 110 isolates drain metal 111, which connects to N+ region 93, from gate 113. Note that the edge of the trench may be located in close proximity with gate 113 to minimize cell size, but not so close as to potentially short the source to the gate.

Although MOSFET 90 is shown having a P-type epitaxial layer 92, the epitaxial layer may alternatively be N-type. The thickness of epitaxial layer 92 is adjusted for the transitional impurity distribution from highly doped substrate 91 to lightly doped epitaxial layer 92. In one implementation, epitaxial layer 92 is about 3 microns thick.

Figure 7:
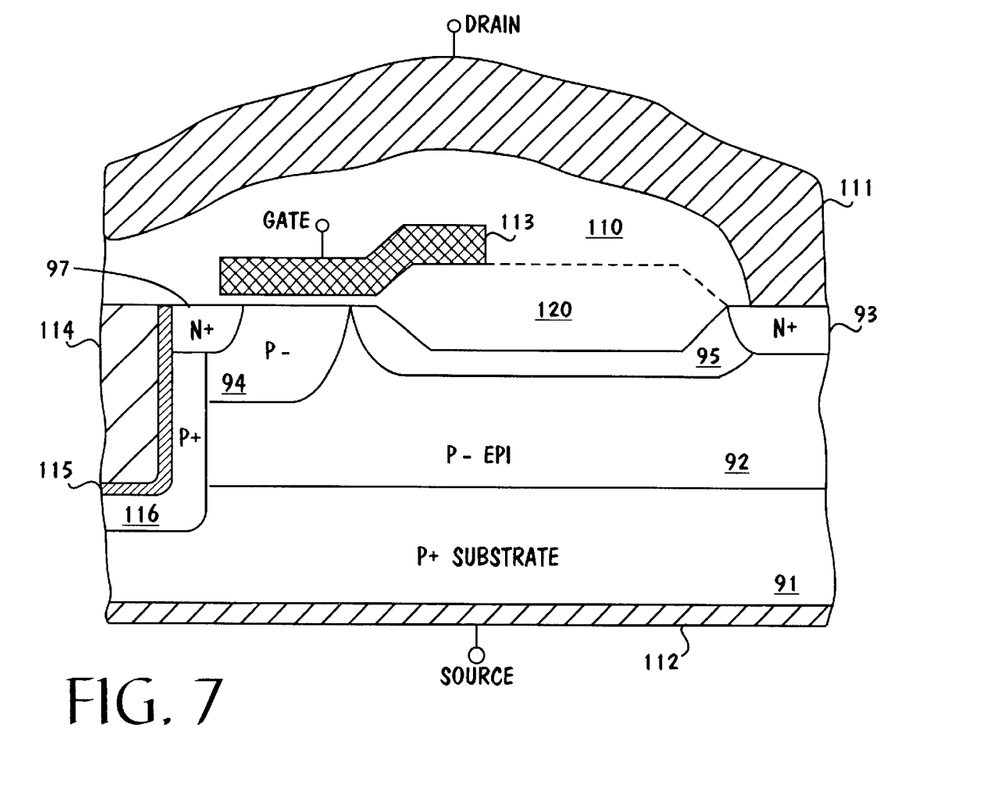
FIG. 7 is a cross-sectional side view of still another embodiment of the lateral MOSFET of the present invention.

FIG. 7 shows still another embodiment of the present invention. The device structure shown in FIG. 7 is the same as that of FIGS. 6A–6C in all respects, except that an additional electric field shaping dielectric layer 120 is included and the gate 113 is extended over a portion of layer 120 for field plating purposes. As discussed in connection with the device structure of FIG. 5, the extension of the gate 113 over the sloped, thicker dielectric layer 120 provides electric field plate shaping that further enhances breakdown voltage.

Figure 8A:
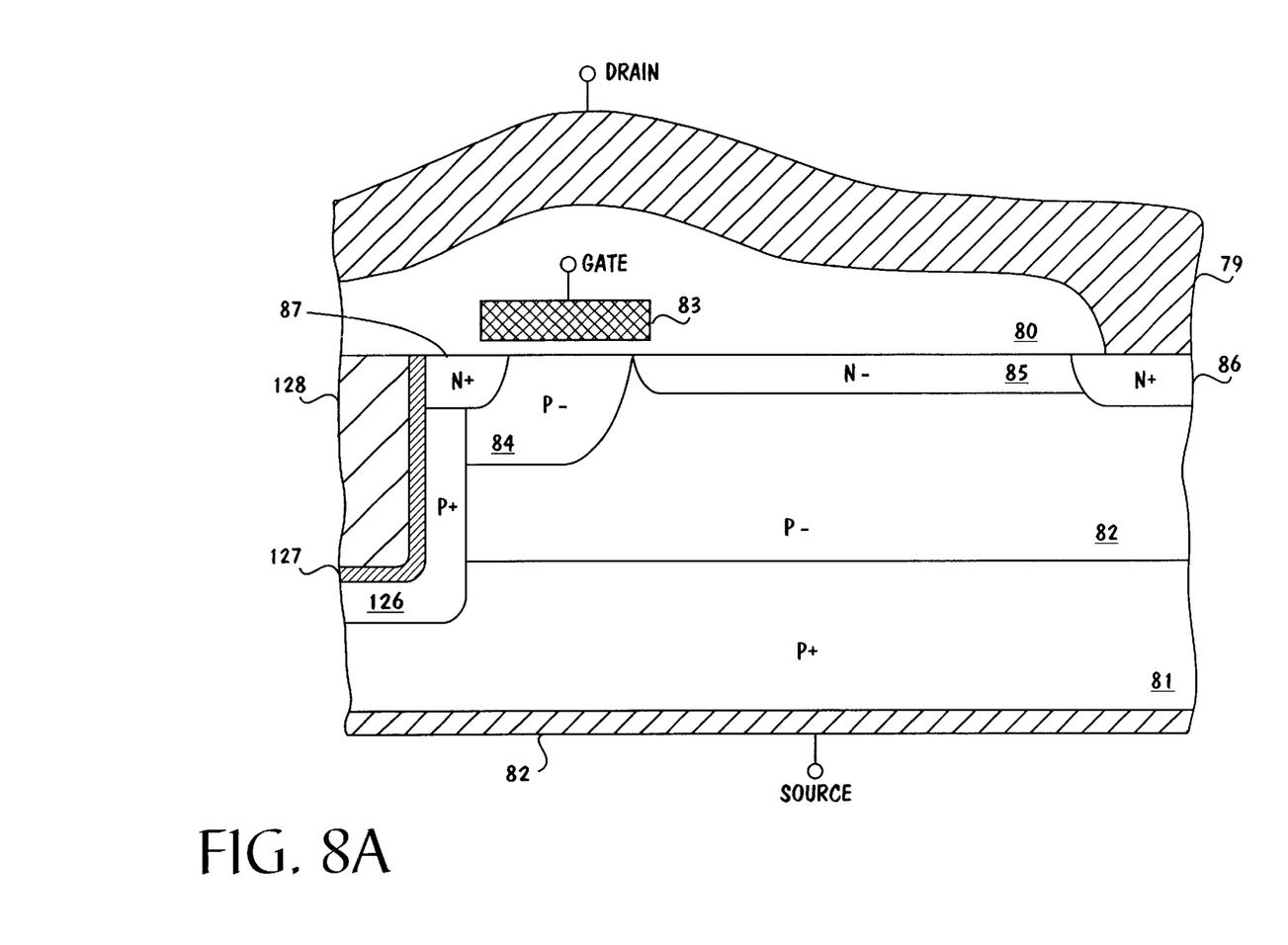
FIGS. 8A–8C are three different views of yet another embodiment of the lateral MOSFET of the present invention.
Figure 8B:
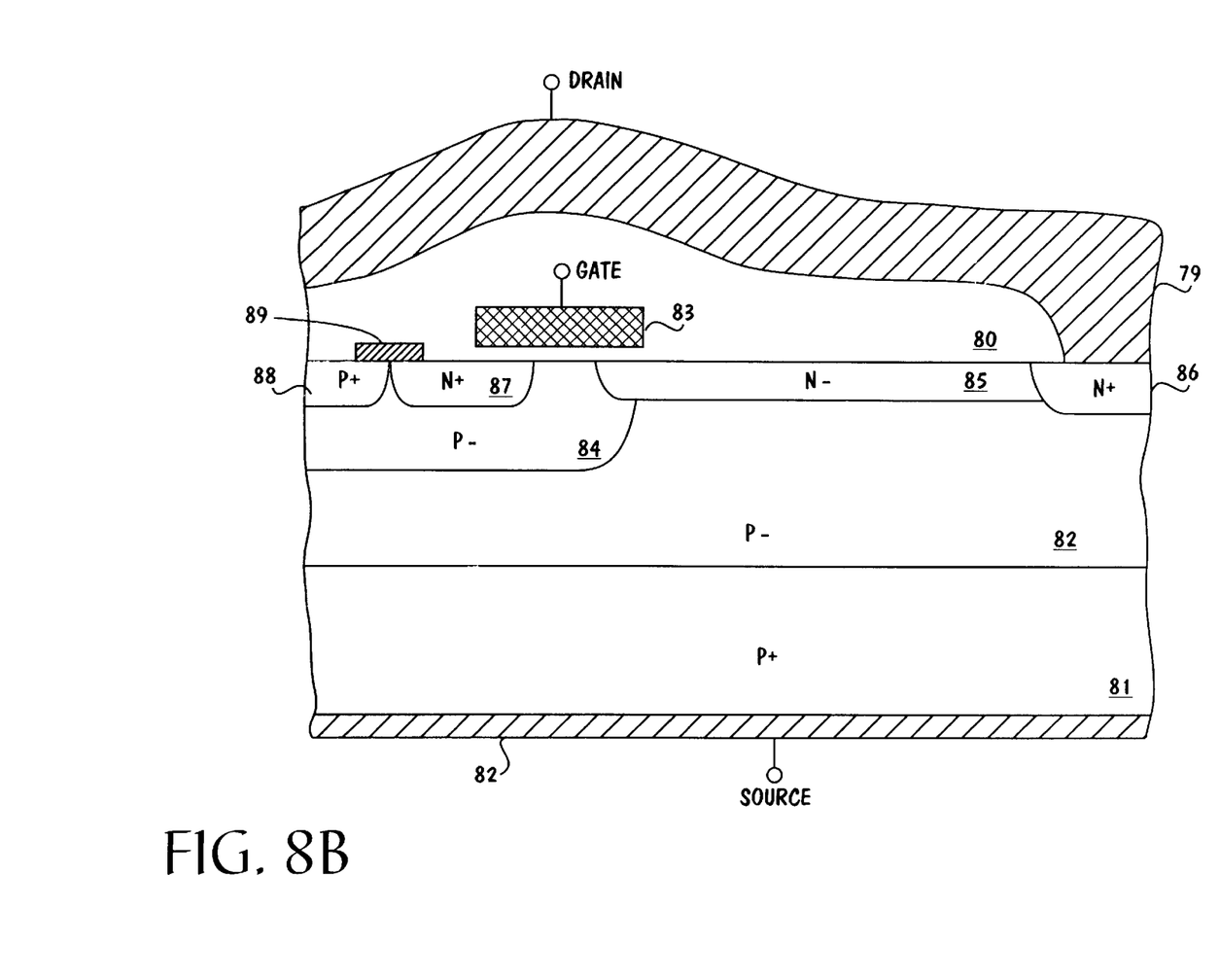
Figure 8C:
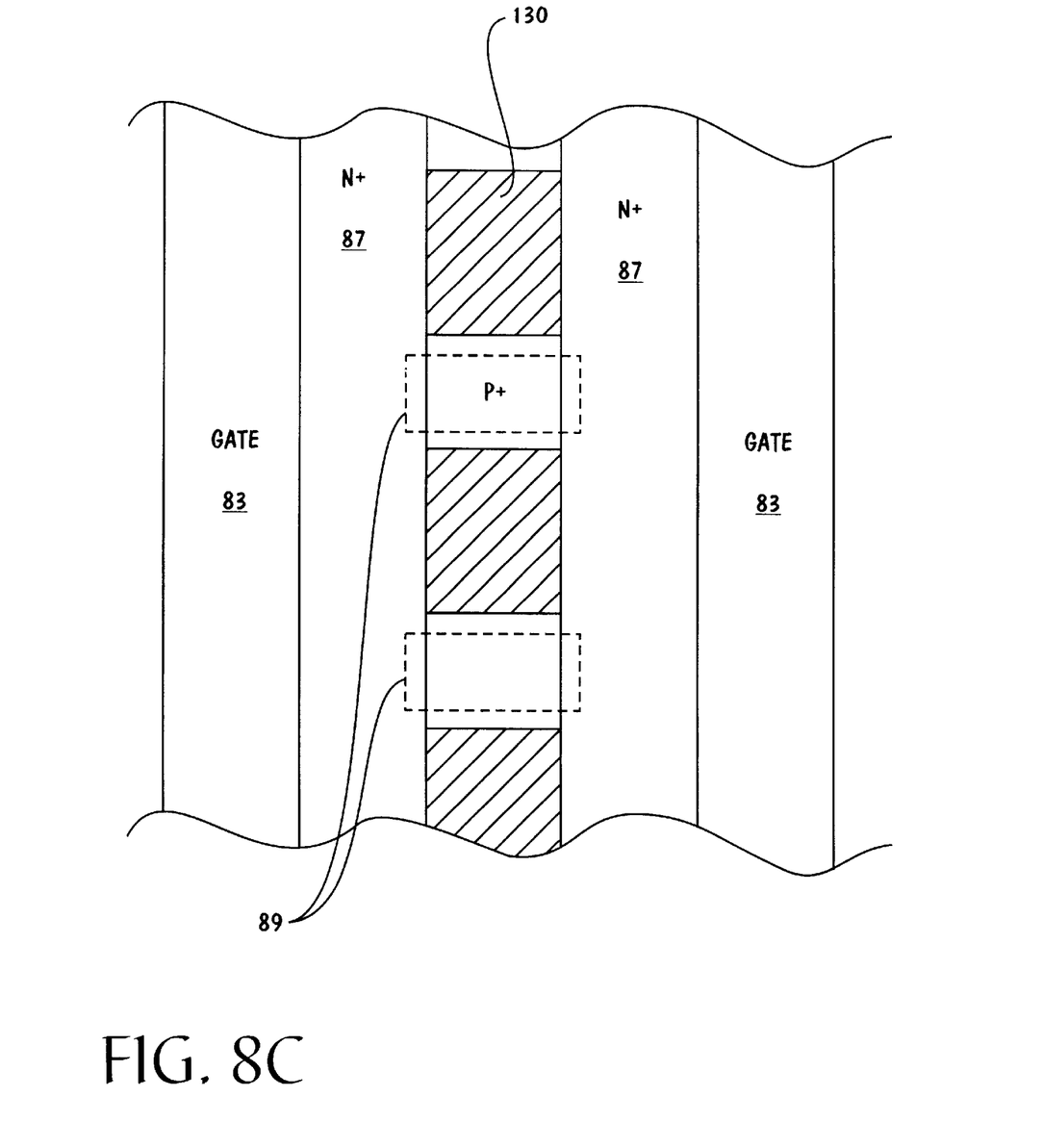

FIGS. 8A–8C illustrate another embodiment of the present invention. FIG. 8C is a partial top view and FIGS. 8A and 8B are cross-sectional side views. Viewed together, they show alternating trench regions 130, which comprise diffusion region 126, conducting layer 127 and metal fill region 128, and the unetched regions, wherein P+ region 88 adjoins N+ source region 87 within P-body region 84. The unetched regions of silicon provide access to P+ region 88, allowing contact to be made with N+ source region 87 utilizing conducting material layer 89. The drain diffusion region 86, extended drain region 85, gate 83, dielectric layer 80, drain metal 79, and P-type epitaxial layer 82 are fabricated as discussed in previous embodiments.

Thus, the embodiment of FIGS. 8A–8C combines a trench type of connection between the source and substrate 81, and a planar, at-the-surface, connection between regions 87 and 88.

I claim:

1. A MOSFET comprising:
   a substrate of a first conductivity type;
   a semiconductor layer disposed over the substrate;
   source and drain regions of a second conductivity type adjoining a top surface of the semiconductor layer, the drain region having an extended portion spaced-apart from the source region;
   a first region of the first conductivity type disposed in the semiconductor layer between the extended portion and the source region, the first region extending at least partially beneath the source region;
   a second region of the first conductivity type that extends from the top surface adjacent the source region through the semiconductor layer to the substrate;
   a third region of the first conductivity type disposed beneath the source region, the third region having a doping concentration sufficiently high to suppress parasitic bipolar transistor action;
   a conducting layer that connects the second region to the source region;
   an insulated gate disposed over the first region between the source region and the extended portion;
   a source metal layer that contacts a bottom surface of the substrate; and
   a drain metal layer that substantially covers the top surface and connects to the drain region, the drain metal layer being isolated from the insulated gate by a thick dielectric layer.

2. The MOSFET of claim 1 further comprising:
   an electric field shaping layer disposed over the extended portion, the insulated gate partially extending over the electric field shaping layer.

3. The MOSFET of claim 1 wherein the thick dielectric layer comprises silicon dioxide.

4. A MOSFET comprising:
   a substrate of a first conductivity type;
   a semiconductor layer of the first conductivity type disposed over the substrate;
   source and drain regions of a second conductivity type adjoining a top surface of the semiconductor layer, the drain region having an extended portion spaced-apart from the source region;
   a first region of the first conductivity type disposed in the semiconductor layer between the extended portion and the source region, the first region extending at least partially beneath the source region;
   a second region of the first conductivity type that extends from the to, surface adjacent the source region through the semiconductor layer to the substrate;
   a conducting lever that connects the second region to the source region; an insulated gate disposed over the first region between the source region and the extended portion;
   a source metal layer that contacts a bottom surface of the substrate; and
   a drain metal layer that substantially covers the ton surface and connects to the drain region, the drain metal layer being isolated from the insulated pate by a thick dielectric layer; and
   wherein the first conductivity type is N-type and the second conductivity type is P-type.

5. A MOSFET comprising:
   a substrate of a first conductivity type;
   a semiconductor layer of a second conductivity type disposed over the substrate;
   source and drain regions of the first conductivity type adjoining a top surface of the semiconductor layer, the drain region having a first portion that extends vertically through the semiconductor layer to connect to the substrate and a second portion that extends laterally along the top surface, the second portion being spaced-apart from the source region;
   a first region of the second conductivity type disposed in the semiconductor layer between the extended region and the source region, the first region extending at least partially beneath the source region;
   a second region of the second conductivity type disposed adjacent the source region;
   an insulated gate disposed over the first region between the source region and the second portion of the drain region;
   a drain metal layer that contacts a bottom surface of the substrate; and
   a source metal layer that substantially covers the top surface and connects to the source region and the second region, the source metal layer being isolated from the insulated gate by a thick dielectric layer.

6. The MOSFET of claim 5 wherein the second region extends at least partially beneath the source region.

7. The MOSFET of claim 5 further comprising:
   an electric field shaping layer disposed over the second portion of the drain region, the insulated gate partially extending over the electric field shaping layer.

8. The MOSFET of claim 5 wherein the first conductivity type is N-type and the second conductivity type is P-type.

9. The MOSFET of claim 5 further comprising:
   a third region of the second conductivity type disposed beneath the source region.

10. The MOSFET of claim 9 wherein the third region has a doping concentration sufficiently high to suppress parasitic bipolar transistor action.

11. The MOSFET of claim 5 wherein the thick dielectric layer comprises silicon dioxide.

12. A MOSFET comprising:
    a substrate of a first conductivity type;
    a semiconductor layer disposed over the substrate;
    source and drain regions of the first conductivity type adjoining a top surface of the semiconductor layer, the drain region having an extended portion spaced-apart from the source region;
    a trench that extends vertically from the top surface down to the substrate, a sidewall surface and e bottom surface of the trench being covered with a first conductive material, and/or diffused into with an impurity, providing a conduction path that connects the drain region to the substrate;
    a first region of the second conductivity type disposed in the semiconductor layer between the extended portion of the drain region and the source region, the first region extending at least partially beneath the source region;

a second region of the second conductivity type disposed adjacent the source region;

an insulated gate disposed over the first region between the source region and the extended portion of the drain region;

a drain metal layer that contacts a bottom surface of the substrate; and a source metal layer that substantially covers the top surface and connects to the source region and the second region, the source metal layer being isolated from the insulated gate by a thick dielectric layer.

13. The MOSFET of claim 12 further comprising:

a third region of the second conductivity type disposed beneath the source region, the third region having a doping concentration sufficiently high to suppress parasitic bipolar transistor action.

14. The MOSFET of claim 12 wherein the trench is at least partially filled with a second conductive material.

15. The MOSFET of claim 14 wherein the first conductive material is a silicide.

16. The MOSFET of claim 15 wherein the second conductive material is selected from the group consisting essentially of a metal, an alloy, and a heavily doped polysilicon.

17. The MOSFET of claim 12 further comprising:

an electric field shaping layer disposed over the extended portion of the drain region, the insulated gate partially extending over the electric field shaping layer.

18. A MOSFET comprising:

a substrate of a first conductivity type;

a semiconductor layer disposed over the substrate;

source and drain regions of the first conductivity type adjoining a ton surface of the semiconductor layer, the drain region having an extended portion spaced-apart from the source region;

a trench that extends vertically from the top surface down to the substrate, a sidewall surface and a bottom surface of the trench being covered with a first conductive material, and/or diffused Into with an impurity, providing a conduction oath that connects the drain region to the substrate, wherein the trench is disposed adjacent the drain region, and the conduction path comprises a diffusion region of the first conductivity type;

a first region of the second conductivity type disposed in the semiconductor layer between the extended portion of the drain region and the source region, the first region extending at least partially beneath the source region;

a second region of the second conductivity type disposed adjacent the source region;

an insulated gate disposed over the first region between the source region and the extended portion of the drain region;

a drain metal aver that contacts a bottom surface of the substrate; and a source metal layer that substantially covers the top surface and connects to the source region and the second region, the source metal layer being isolated from the insulated gate by a thick dielectric layer.

19. A MOSFET comprising:

a substrate of the first conductivity type;

a semiconductor layer disposed over the substrate;

source and drain regions of a second conductivity type adjoining a top surface of the semiconductor layer, the drain region having an extended portion spaced-apart from the source region;

a trench that extends vertically from the too surface down to the substrate, a sidewall surface and a bottom surface of the trench being covered with a first conductive material, and diffused into with an Impurity of the first conductivity type, providing a conduction path that connects the source region to the substrate, wherein the trench is disposed adjacent the source region;

a first radon of a first conductivity type disposed in the semiconductor layer between the extended portion of the drain region and the source region, the first region extending at least partially beneath the source region;

an insulated gate disposed over the first region between the source region and the extended portion of the drain region;

a source metal layer that contacts a bottom surface of the substrate; and a drain metal layer that substantially covers the top surface and connects to the drain region, the drain metal layer being isolated from the insulated pate by a thick dielectric layer.

20. The MOSFET of claim 19 wherein the trench is at least partially filled with a second conductive material.

21. The MOSFET of claim 20 wherein the second conductive material is selected from the group consisting essentially of a metal, an alloy, and a heavily doped polysilicon.

22. The MOSFET of claim 19 wherein the first conductive material comprises a siliclde.

23. The MOSFET of claim 19 further comprising:

an electric field shaping layer disposed over the extended portion of the drain region, the insulated gate partially extending over the electric field shaping layer.

24. The MOSFET of claim 19 wherein the trench is at least partially filled with a non-conductive material.

25. A MOSFET comprising:

a substrate of a first conductivity type;

a semiconductor layer disposed over the substrate:

source and drain regions of a second conductivity type adjoining a top surface of the semiconductor layer, the drain region having an extended portion spaced-apart from the source region;

a first region of the first conductivity type disposed in the semiconductor layer between the extended portion of the drain region and the source region, the first region extending at least partially beneath the source region;

a second region of the first conductivity type, the source region and the second region each comprising multiple regions disposed in an adjacently alternating manner;

a trench that extends vertically from the top surface down to the substrate, a sidewall surface and a bottom surface of the trench being covered with a first conductive material, and/or diffused into with an impurity; providing a conduction path that connects the source and second regions to the substrate;

an insulated gate disposed over the first region between the source region and the extended portion of the drain region;

a source metal layer that contacts a bottom surface of the substrate; and a drain metal layer that substantially covers the ton surface and connects to the drain region, the drain metal lever being isolated from the insulated gate by a thick dielectric layer.

26. The MOSFET of claim 25 wherein the semiconductor layer is of the first conductivity type.

27. The MOSFET of claim 25 wherein the semiconductor layer is of the second conductivity type.

28. A MOSFET comprising:

a substrate of a first conductivity type;

a semiconductor layer of the first conductivity type disposed over the substrate;

source and drain regions of the a second conductivity type adjoining a top surface of the semiconductor layer, the drain region having an extended portion spaced-apart from the source region;

a trench that extends vertically from the top surface down to the substrate, a sidewall surface and the bottom surface of the trench being covered with a first conductive material and/or conducting diffusion region connected to the source region the trench region being formed only in part of an area near the source;

a first region of the first conductivity type disposed in the semiconductor layer between the extended portion of the drain region and the source region, the first region extending at least partially beneath the source region;

a second region of the first conductivity type disposed adjacent the source region in the area where the trench region is absent;

a conducting layer that connects the second region to the source region;

an insulated gate disposed over the first region between the source region and the extended portion of the drain region;

a source metal layer that contacts a bottom surface of the substrate; and a drain metal layer that substantially covers the top surface and connects to the drain region, the drain metal layer being isolated from the insulated gate by a thick dielectric layer.

29. The MOSFET of claim 28 wherein conducting diffusion region connects with the substrate.

30. The MOSFET of claim 28 wherein the first conductive material is a silicide.

31. The MOSFET of claim 28 wherein the second conductive material is selected from the group consisting essentially of a metal, an alloy, and a heavily doped polysilicon.

32. The MOSFET of claim 28 further comprising: an electric field shaping layer disposed over the extended portion of the drain region, the insulated gate partially expending over the electric field shaping layer.

* * * * *